US011885019B2

(12) United States Patent
Hawkins et al.

(10) Patent No.: US 11,885,019 B2
(45) Date of Patent: *Jan. 30, 2024

(54) SUSCEPTOR WITH RING TO LIMIT BACKSIDE DEPOSITION

(71) Applicant: ASM IP HOLDING B.V., Almere (NL)

(72) Inventors: Mark Hawkins, Gilbert, AZ (US); Matthew G. Goodman, Chandler, AZ (US); Shawn Thomas, Gilbert, AZ (US)

(73) Assignee: ASM IP Holding B.V., Almere (NL)

( * ) Notice: Subject to any disclaimer, the term of this patent is extended or adjusted under 35 U.S.C. 154(b) by 290 days.

This patent is subject to a terminal disclaimer.

(21) Appl. No.: 17/395,240

(22) Filed: Aug. 5, 2021

(65) Prior Publication Data

US 2021/0363637 A1 Nov. 25, 2021

Related U.S. Application Data

(62) Division of application No. 13/284,231, filed on Oct. 28, 2011, now Pat. No. 11,085,112.

(51) Int. Cl.
| | |
|---|---|
| *C23C 16/455* | (2006.01) |
| *H01L 21/687* | (2006.01) |
| *C23C 16/458* | (2006.01) |
| *H01L 21/67* | (2006.01) |

(52) U.S. Cl.
CPC ...... *C23C 16/45521* (2013.01); *C23C 16/458* (2013.01); *C23C 16/4582* (2013.01); *C23C 16/4583* (2013.01); *C23C 16/4585* (2013.01); *H01L 21/6875* (2013.01); *H01L 21/68735* (2013.01); *H01L 21/67115* (2013.01)

(58) Field of Classification Search
CPC .......... C23C 16/45521; C23C 16/4585; C23C 16/458; C23C 16/4582; C23C 16/4583; H01L 21/6875; H01L 21/68735; H01L 21/67115
See application file for complete search history.

(56) References Cited

U.S. PATENT DOCUMENTS

| | | | |
|---|---|---|---|
| 5,583,736 A | 12/1996 | Anderson et al. | |
| 6,077,357 A | 6/2000 | Rossman et al. | |
| 6,086,680 A | 7/2000 | Foster et al. | |
| 6,634,882 B2 | 10/2003 | Goodman | |
| 6,709,267 B1 | 3/2004 | Hawkins et al. | |
| 7,033,445 B2 | 4/2006 | Keeton et al. | |
| 7,601,224 B2 | 10/2009 | Foree | |
| 7,648,579 B2 | 1/2010 | Goodman et al. | |
| 11,085,112 B2 * | 8/2021 | Hawkins | C23C 16/4582 |
| 2002/0023590 A1 | 2/2002 | Storbeck | |
| 2003/0049580 A1 | 3/2003 | Goodman | |

(Continued)

FOREIGN PATENT DOCUMENTS

WO   WO 2010/016964   2/2010

*Primary Examiner* — Jeffrie R Lund
(74) *Attorney, Agent, or Firm* — Banner & Witcoff, Ltd.

(57) ABSTRACT

A susceptor including a generally circular body having a face with a radially inward section and a radially outward section proximate a circumference of the body, the radially outward section having at least one ring extending upward for contacting a bottom surface of a substrate, and wherein the radially inward section lacks a ring extending upward from the face.

20 Claims, 9 Drawing Sheets

(56) References Cited

U.S. PATENT DOCUMENTS

| | | |
|---|---|---|
| 2003/0205324 A1 | 11/2003 | Keeton et al. |
| 2004/0060512 A1 | 4/2004 | Waldhauer et al. |
| 2005/0092439 A1 | 5/2005 | Keeton et al. |
| 2005/0207089 A1 | 9/2005 | Ito |
| 2005/0284372 A1 | 12/2005 | Murugesh et al. |
| 2007/0269294 A1 | 11/2007 | Nagasaka et al. |
| 2009/0280248 A1 | 11/2009 | Goodman et al. |
| 2010/0013169 A1 | 1/2010 | Monteen et al. |
| 2013/0109192 A1 | 5/2013 | Hawkins et al. |
| 2020/0371447 A1 | 11/2020 | Kunnen et al. |
| 2021/0363637 A1* | 11/2021 | Hawkins ........... H01L 21/68735 |
| 2023/0280663 A1* | 9/2023 | Kunnen ................. G03F 7/707 |
| | | 355/72 |

* cited by examiner

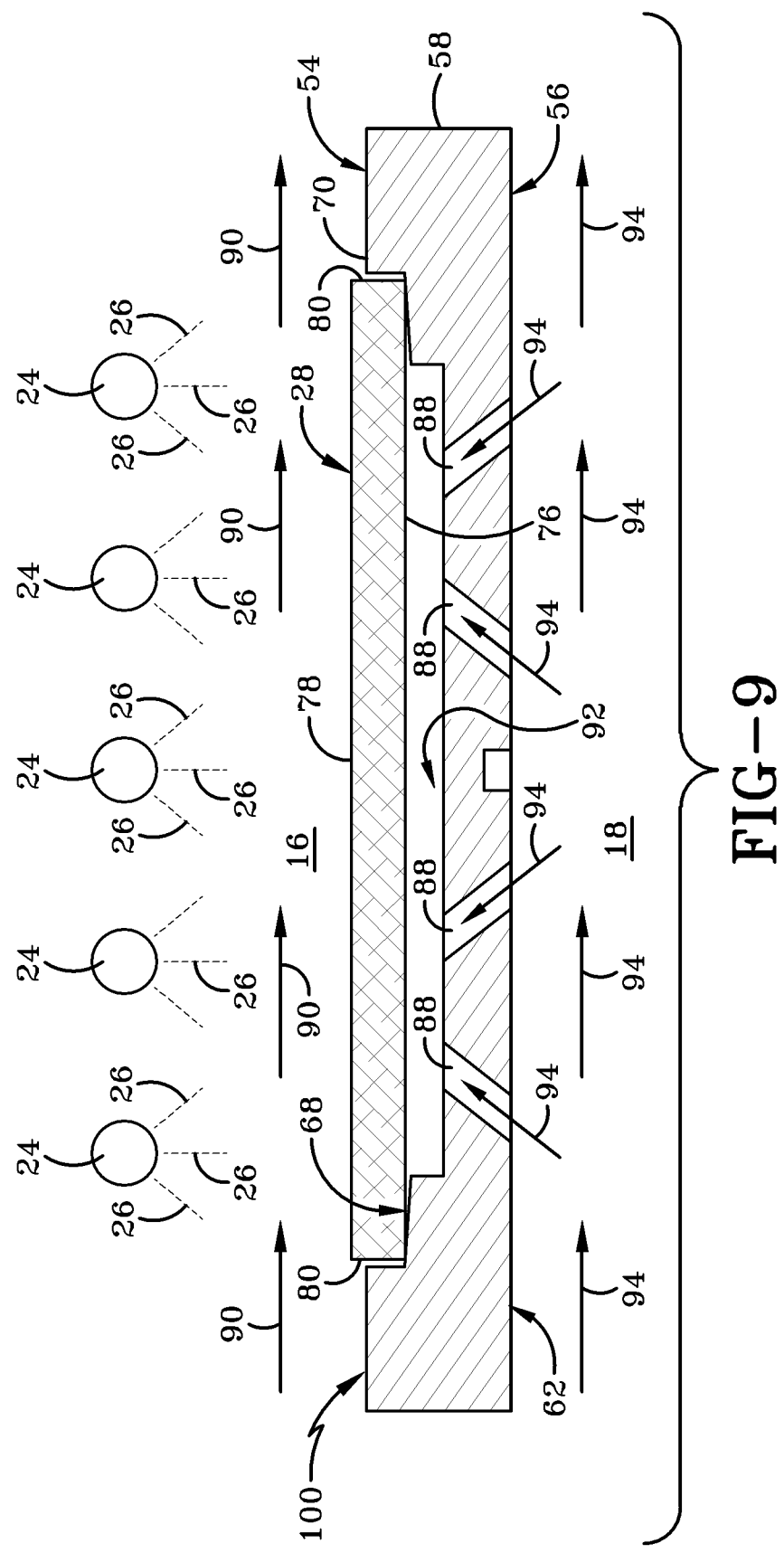

SUSCEPTOR WITH RING TO LIMIT BACKSIDE DEPOSITION

This application is a divisional of U.S. application Ser. No. 13/284,231, filed Oct. 28, 2011, entitled "SUSCEPTOR WITH RING TO LIMIT BACKSIDE DEPOSITION" the entire contents of which are hereby incorporated by reference herein.

FIELD OF THE INVENTION

This disclosure relates generally to semiconductor processing, and more particularly to susceptors for supporting semiconductor substrates in process chambers.

BACKGROUND

Semiconductor fabrication processes are typically conducted with the substrates supported within a chamber under controlled conditions. For many purposes, semiconductor substrates (e.g., wafers) are heated inside the process chamber. For example, substrates can be heated by direct physical contact with an internally heated wafer holder or "chuck." "Susceptors" are wafer supports used in radiantly heated systems where the wafer and susceptors absorb radiant heat.

Susceptors are commonly formed by machining graphite into a desired shape and applying a silicon carbide (SiC) Coating. Susceptors can be formed in different shapes, but many are circular.

A number of quality control issues can arise during processing, including but not limited to substrate sliding, sticking, curling, and backside deposition. Slide occurs during drop off when a cushion of gas in the susceptors recess or pocket is unable to escape fast enough to allow the substrate to fall immediately onto the susceptor. The substrate floats momentarily above the susceptor as the gas slowly escapes, and it tends to slide off center. Thus, the substrate may not rest in the center of the pocket where it was intended, and uneven heating of the substrate may result.

Backside deposition occurs when process gases work into the space between the substrate and the susceptor and are able to deposit on a back surface of the substrate. Because the flow of the process gases is not controlled between the substrate and the susceptor, random deposition can occur on the backside of the substrate. This random deposition can create thickness inconsistencies on the backside, which can affect local site flatness on the frontside, and ultimately device thickness issues.

SUMMARY

Various aspects and implementations are disclosed herein that relate to susceptor designs and methods for processing with susceptors. In one aspect, a susceptor including a generally circular body having a face with a radially inward section and a radially outward section proximate a circumference of the body, the radially outward section having at least one ring extending upward from the face for contacting a bottom surface of a substrate, and wherein the radially inward section lacks a ring extending upward from the face.

In an implementation, the at least one ring may be a plurality of rings concentrically disposed on the radially outward section. The at least one ring may be at least six rings. The radially outward section may be angled with respect to the radially inward section. The angle may be approximately three degrees. The at least six rings may be spaced apart from one another by approximately 0.5 mm.

The radially inward portion may further include a gridded surface extending upward from the face. The gridded surface may be at least partially concave in shape. The gridded surface may further include a plurality of protrusions spaced apart approximately 1.25 mm from one another. Each of the plurality of protrusions may further include angled outer walls. The radially inward section surface area may be approximately 1600 times larger than the radially outward section surface area. The radially outward section may further include a shoulder extending upward above the at least one ring at a position outside the at least one ring. The at least one ring may be a continuous ring. The at least one ring may further include a constant radius.

In another aspect, a reaction system includes a substrate holder including a body having a top surface and a bottom surface, the top surface having a radially inward section with a gridded surface extending upward from the radially inward section, the top surface having a radially outward section with at least one ring extending upward from the radially outward section, and wherein the radially outward section is angled with respect to the radially inward section.

The at least one ring may be at least six rings, each ring arranged separate from one another and being continuously disposed on the radially outward section. The gridded surface may be composed of a plurality of protrusions and wherein a top of each of the plurality of protrusions defines a substrate contact surface.

In still another aspect, a method of supporting a substrate includes the steps of providing a susceptor in a reaction chamber, the susceptor including a radially inward section having a face for receiving the substrate, the face having a gridded surface extending upward and a radially outward section having at least one ring extending upward, positioning the substrate above the susceptor, locating the substrate in contact with the gridded surface and the at least one ring, limiting a backside deposition with the contact between the at least one ring and the substrate, and limiting lateral movement of the substrate to 2 mm with the contact between the gridded surface and the substrate.

The susceptor radially outward section may be angled with respect to the radially inward section. The susceptor at least one ring may be at least five rings.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 9 schematically shows a cross-section of a semiconductor susceptor according to an embodiment of the present disclosure during one phase of the processing.

DETAILED DESCRIPTION

The present aspects and implementations may be described in terms of functional block components and various processing steps. Such functional blocks may be realized by any number of hardware or software components configured to perform the specified functions and achieve the various results. For example, the present aspects may employ various sensors, detectors, flow control devices, heaters, and the like, which may carry out a variety of functions. In addition, the present aspects and implementations may be practiced in conjunction with any number of processing methods, and the apparatus and systems described may employ any number of processing methods, and the apparatus and systems described are merely examples of applications of the invention.

Figure 1:
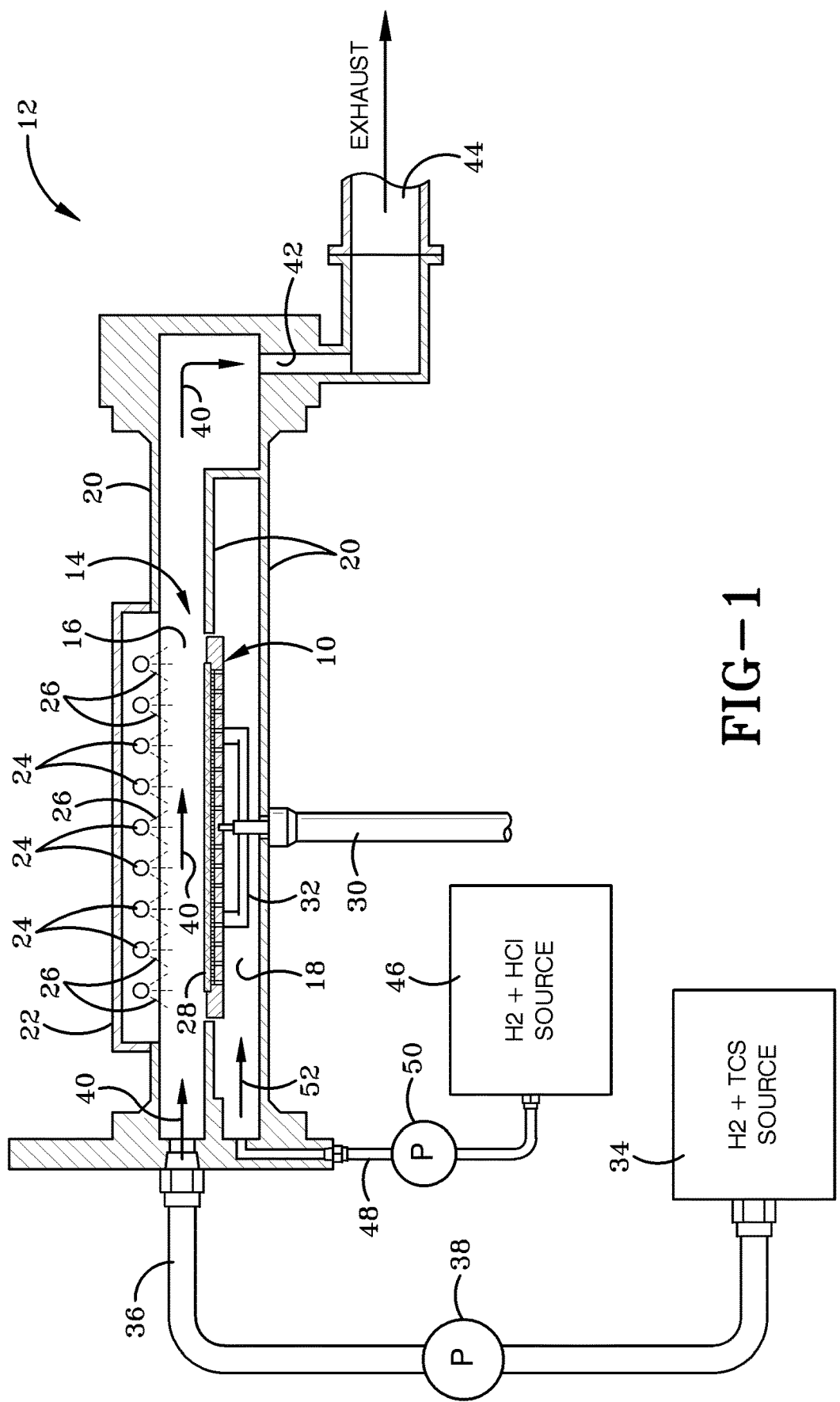
FIG. 1 schematically shows a cross-section of a semiconductor process module according to an embodiment of the present disclosure.

FIGS. 1-7 illustrate a first aspect susceptor 10 positioned within a semiconductor processing environment 12 having a reaction chamber (or processing chamber) 14 with an upper chamber 16 and a lower chamber 18. Referring to FIG. 1, reaction chamber 14 includes walls 20 forming at least a portion of the outer perimeter of each chamber and may be composed of any suitable material, including but not limited to quartz. A heating element housing 22 may be formed in upper chamber 16 above susceptor 10 to secure radiant heating elements 24 to produce heat 26 directed at susceptor 10 and a workpiece 28 (e.g., a substrate or semiconductor wafer).

Susceptor 10 may be secured directly to an elevator 30 through susceptor mount 32 to permit vertical positioning of the susceptor 10 and workpiece 28 thereon. Further, while not shown, a heating element may be located adjacent susceptor 10 without departing from the spirit and scope of the disclosure.

Upper chamber 16 may be fed a reactant or precursor material 34, such as Trichlorosilane (TCS) with a carrier gas such as $H_2$ or any other suitable precursor or carrier gases, through gas line 36 by pump 38. Precursor 34 is feed through upper chamber 16 in the direction associated with arrows 40 until reaching exhaust aperture 42 and ultimately exhaust port 44, thereby providing a laminar flow of process gases through the reaction chamber 14, which can function as a laminar flow reaction chamber. In a similar fashion, a second precursor source 46 may be hydrogen chloride (HCl) with an $H_2$ carrier or any other suitable precursor which is pumped through gas line 48 by pump 50. Precursor 46 is then introduced into lower chamber 18 in the direction associated with arrows 52 where it then may escape to the upper chamber through gaps between the susceptor and a graphite ring and between the graphite ring and the quartz chamber, not specifically shown. Precursor 46 may then exit through exhaust aperture 42 and exhaust outlet 44.

While not specifically shown, the reaction chamber may be a single chamber instead of a split chamber, or may be a reduced volume chamber, or any combination of chamber attributes. Further, precursor 46 may be arranged to include a separate exhaust port if intermingling of the precursors is not desired. In addition, one or more other precursors or process gases may be connected in gas communication with the gas lines 36 or 48, as desired, to provide the additional gas species for processes performed in the chamber 16.

Figure 2:
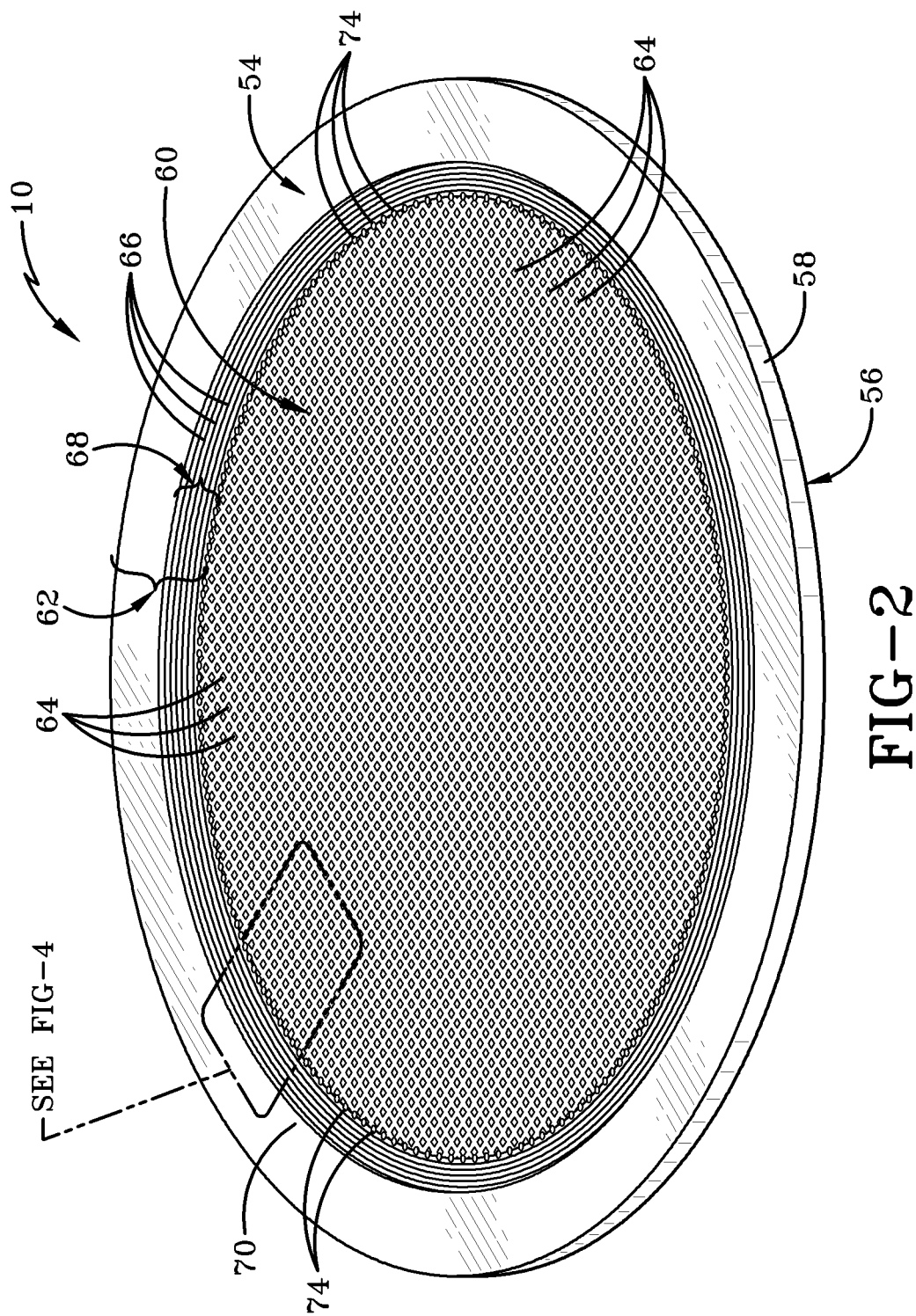
FIG. 2 is a perspective view of a susceptor top side according to an embodiment of the present disclosure.
Figure 3:
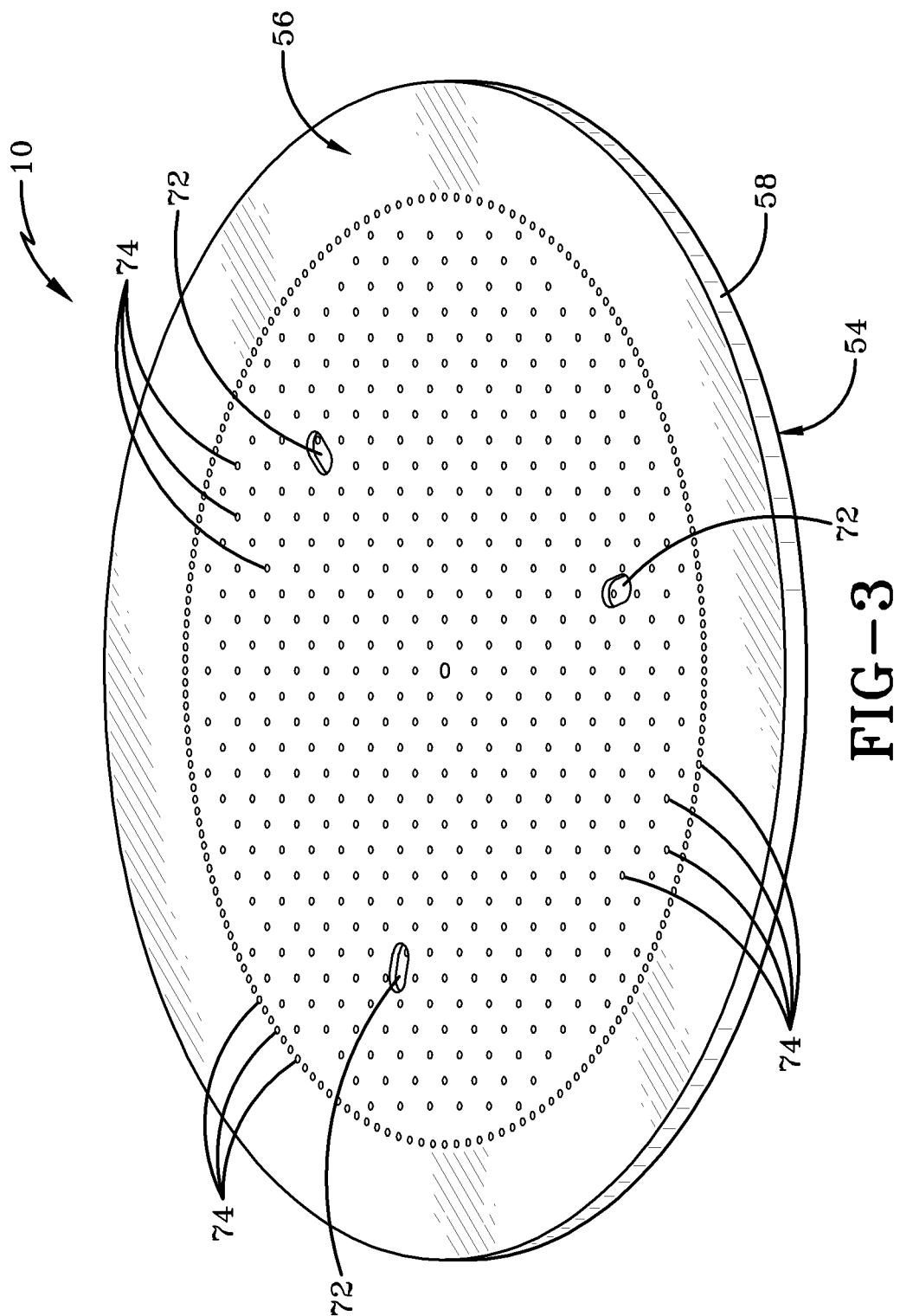
FIG. 3 is a perspective view of a susceptor bottom side according to an embodiment of the present disclosure.

FIGS. 2 and 3 illustrate top and bottom views respectively of susceptor 10 having a face or top surface 54, a bottom surface 56, and a side surface 58. Top surface 54 may include a radially inward section 60 and a radially outward section 62 extending from the face of the susceptor 10. Radially inward section 60 may include a plurality of protrusions 64 spaced apart from one another. Radially outward section 62 is proximate a circumference of the susceptor 10 and may include at least one ring 66 extending upwards from the face at an angled portion 68. In one aspect, the angled portion 68 extends from the outer perimeter of the radially inward section 60 until the termination of the at least one ring 66. In a preferred implementation, anywhere from one to ten rings 66 extend upward from the radially outward section 62. A shoulder 70 may be located adjacent the at least one ring 66 to form the remainder of the radially outward section 62.

Referring to FIG. 3, bottom surface 56 of susceptor 10 may include apertures 72 to connect the susceptor 10 to the elevator 30 (FIG. 1) and a plurality of holes 74 or other suitable passageway to permit process gas to pass through the susceptor body. While only a few holes 74 are labeled, any suitable number and orientation of holes 74 may be utilized. Further, any suitable number of apertures 72 may be utilized, including zero if the susceptor 10 is mounted to a heater and not directly mounted to an elevator. The bottom surface 56 is also shown having generally inward and outward sections due to the placement of holes 74. In the event no holes are utilized, or as desired for the processing application, there need not be a noticeable division between the radially inward and radially outward sections 60 and 62.

Figure 4:
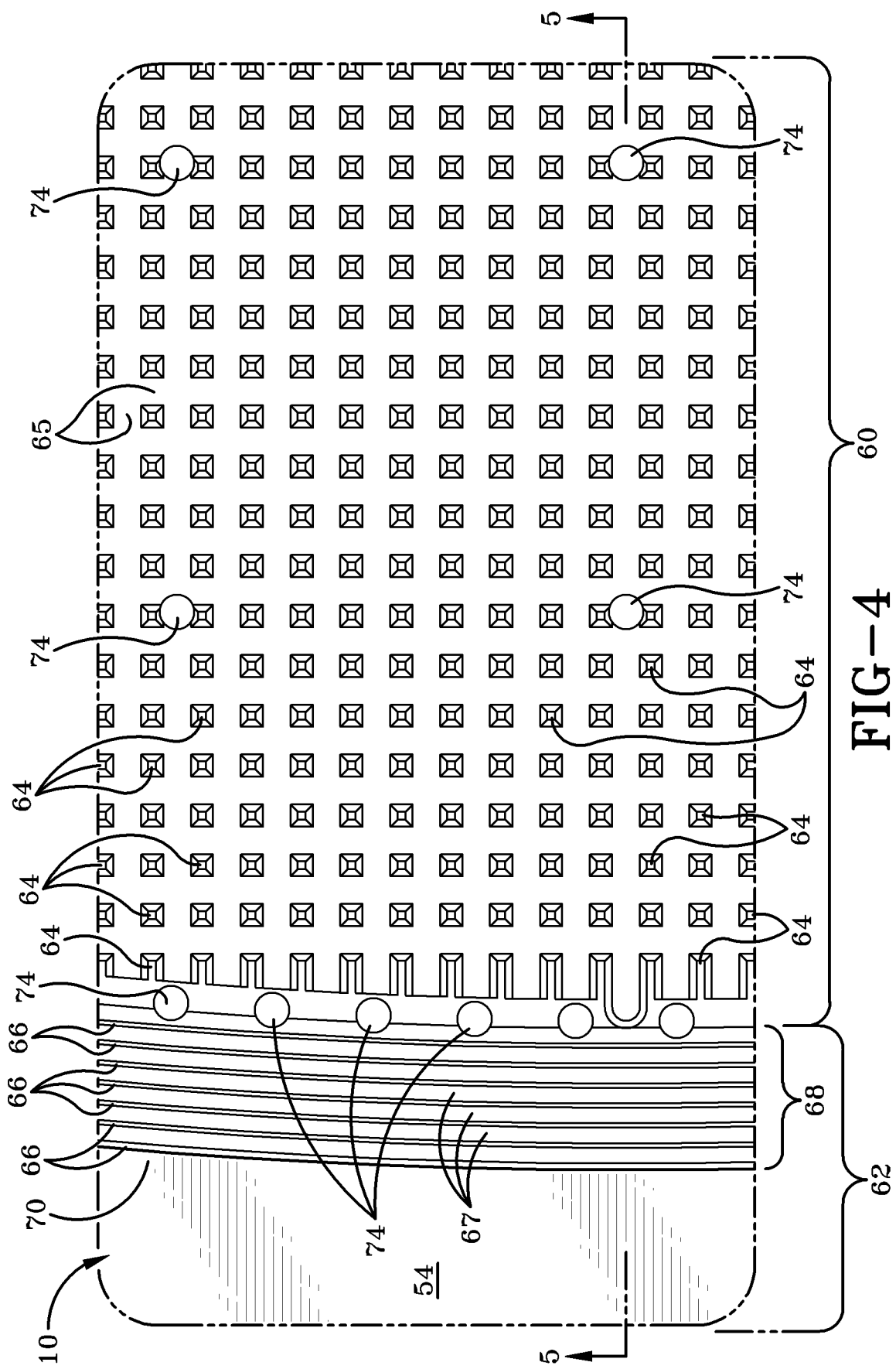
FIG. 4 is an enlarged view of the section labeled FIG. 4 in FIG. 2.

Referring now to FIG. 4, an enlarged view of the interchange between radially inward section 60 and radially outward section 62 is shown in greater detail. Protrusions 64 are shown extending in a grid-like fashion along the face of radially inward section 60 with grooves 65 formed between each set of protrusions 64. Near the interchange of the radially inward and outward sections 60 and 62, protrusions 64 may be elongated as shown near rings 66 to provide a consistent surface for a workpiece (not shown in this FIG). Each protrusion 64 is preferably evenly spaced apart from adjacent protrusions to provide both consistency through the wafer and from wafer to wafer.

In one aspect, a gridded susceptor face with protrusions 64 may function to create grooves 65 that function as a cavity for providing a cushioning gas during wafer loading. The protrusions may be configured to provide a volume of gas underneath the wafer to allow gas to compress and escape, to minimize wafer sliding when a wafer is placed on a susceptor, and for gas to expand and flow in under the wafer to minimize wafer sticking when the wafer is lifted from the susceptors. U.S. Pat. No. 7,601,224, assigned to ASM America, Inc. issued on Oct. 13, 2009 describes the cushioning gas procedure in more detail and the disclosure of which is hereby incorporated herein by reference.

Figure 5:
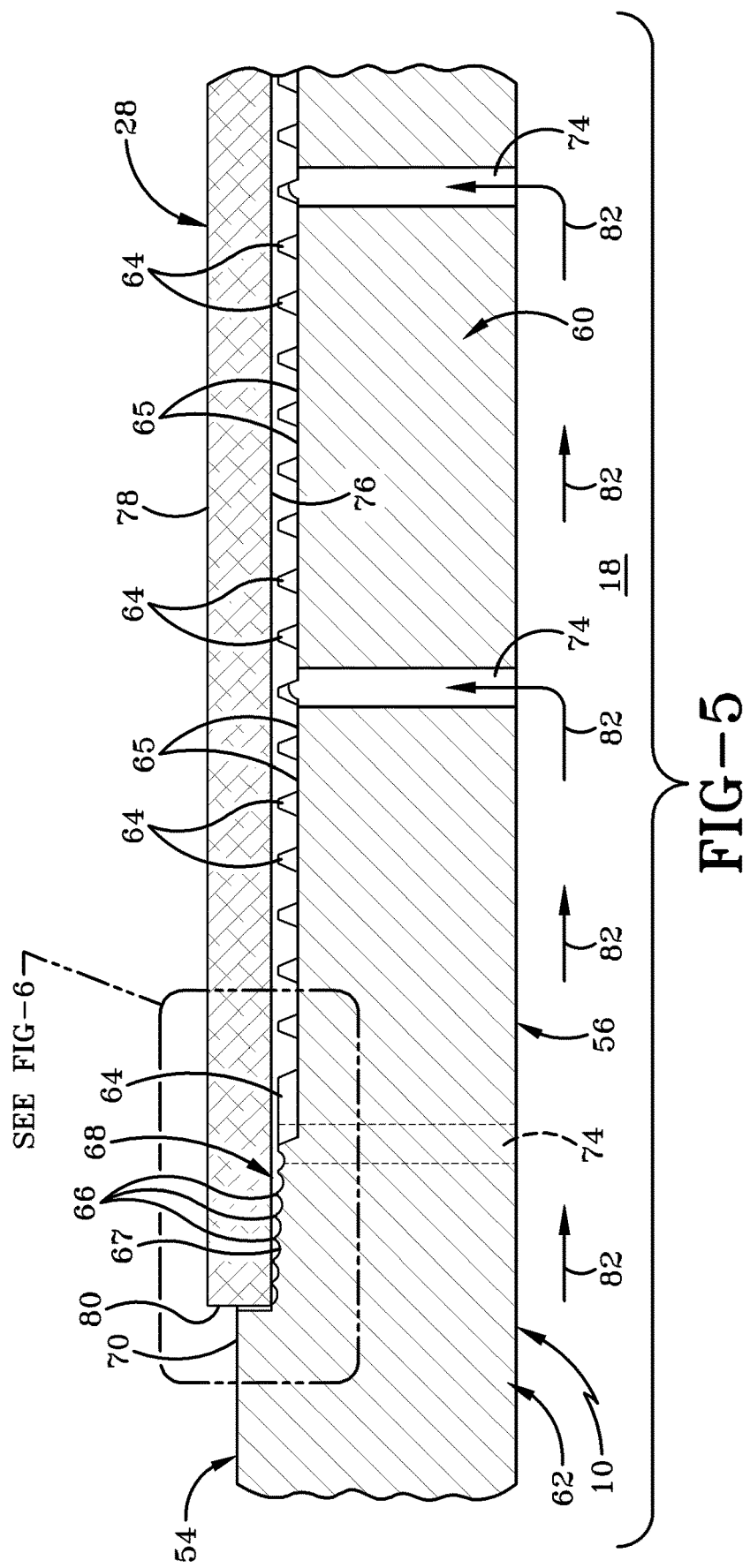
FIG. 5 is an enlarged view of a substrate positioned on the susceptor taken generally about line 5-5 in FIG. 4.

FIG. 5 illustrates workpiece 28 resting on susceptor 10 for processing. Specifically, a bottom surface 76 of workpiece 28 is resting on rings 66 and may be contacting protrusions 64. Workpiece 28 also includes a top surface 78 and a side surface 80, wherein side surface 80 may be adjacent shoulder 70 of susceptor 10 and top surface 78 may be positioned above shoulder 70 during processing. Advantageously, this arrangement permits process gases to minimally contact side surface 80 and appropriately contact top surface 78 for wafer processing. As further shown, precursor 46 may travel in the direction associated with arrows 82 through holes 74 in susceptor 10 and contact bottom surface 76.

Figure 6:
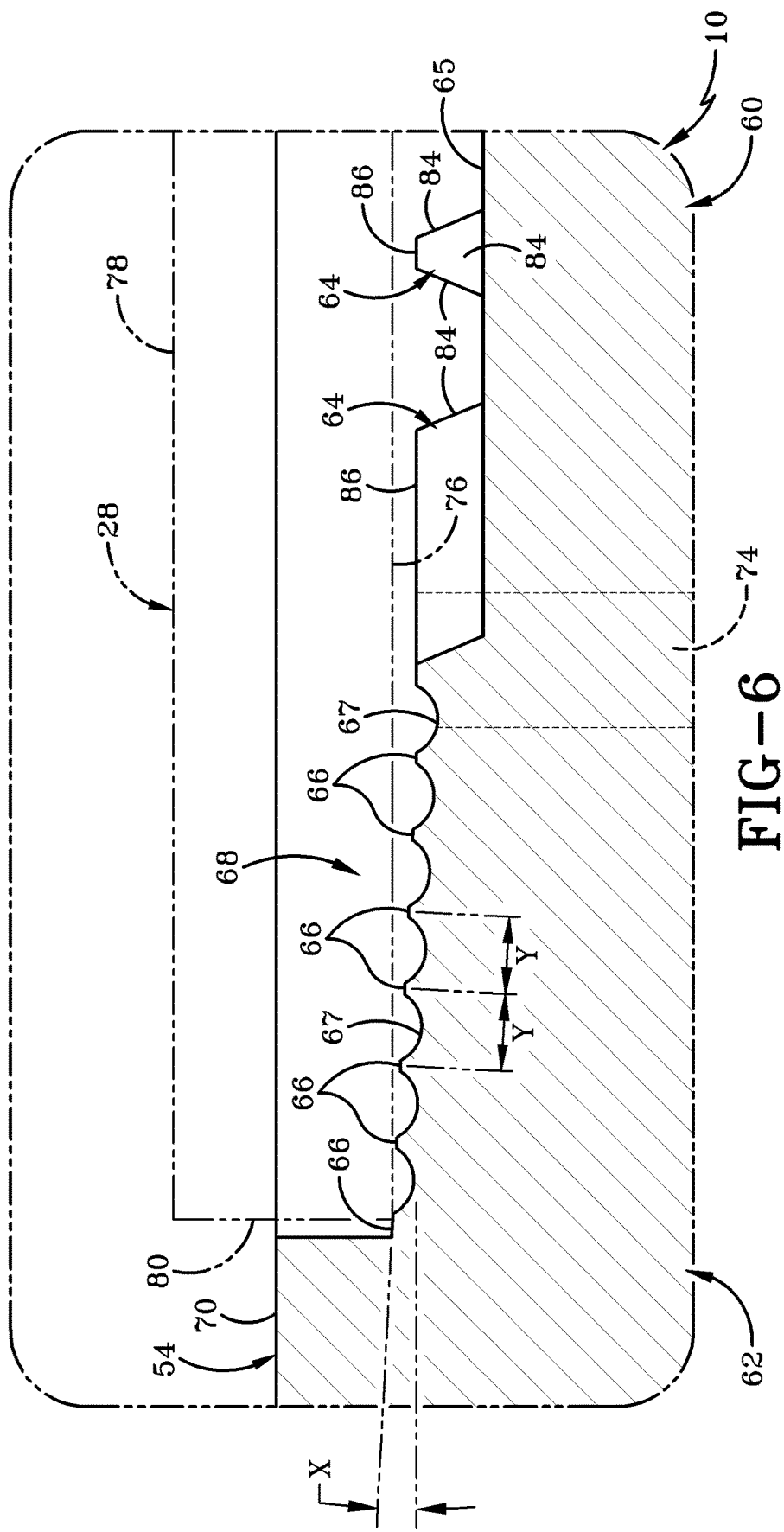
FIG. 6 is an enlarged view of the section labeled FIG. 6 in FIG. 4 with a substrate in dashed lines.

Referring to FIG. 6, protrusions 64 are illustrated having angled sidewalls 84 terminating at top wall 86. The array of protrusions 64 are arranged to provide a generally gridded surface which extends upward from the face of the susceptor 10 and provides a contact surface for the workpiece backside 76 after a cushioning gas is dissipated. The protrusions 64 are spaced apart from one another a suitable distance, which may be approximately 0.1 to approximately 10 millimeters, and is preferably approximately 1.25 millimeters. Still further, protrusions 64 may be arranged to be at least partially concave in shape to assist in workpiece locating. The concave shape may occur due to a curved surface where protrusions 64 extend upwards from, or by varying the height and shape of protrusions 64 as they extend upwards from outside to the center of the susceptor.

Radially outward of protrusions 64 are rings 66 which are concentrically disposed on radially outward section 62. In one aspect, the rings are spaced apart a distance Y from one another anywhere from approximately 0.05 to approximately 5 millimeters and preferably approximately 0.5 mm Rings 66 may be continuously disposed on the radially outward section 62 and may include a constant radius for consistent workpiece locating. Radially outward section 62 may also be oriented at an angle X from approximately zero to approximately ten degrees, and preferably approximately three degrees. Due to the relatively small size of radially outward section 62, radially inward section 60 may have a surface area approximately 1600 times larger than the radially outward section.

In operation, rings 66 are useful to help reduce backside deposition on the workpiece and particularly the backside 76 of the workpiece 28. Rings 66 ensure a continuous ridge contacts the backside of the workpiece near the circumference of the workpiece to prevent process gas from reaching the backside 76 of the workpiece 28. Protrusions 64, on the other hand, provide grip on the workpiece during processing, workpiece loading, and workpiece unloading. While FIG. 6 does not explicitly illustrate protrusions 64 contacting workpiece 28, such contact is envisioned within the spirit and scope of the disclosure. The separation illustrated is merely to provide a better understanding of the disclosure. Specifically, during workpiece loading and unloading, protrusions 64 greatly reduce workpiece slippage by allowing gas flow between the protrusions and providing a constant contact surface after the cushioning gas dissipates to limit lateral movement to less than 2 mm in any direction. Advantageously, the workpiece 28 is processed more consistently because the workpiece 28 does not slip during loading and backside deposition is greatly reduced.

A method of supporting workpiece 28 may include providing susceptor 10 with radially inward section 60 and radially outward section 62 in reaction chamber 14 (FIG. 1) with at least one ring 66 extending upward in the radially outward section 62 and arranged to receive workpiece 28. The workpiece 28 is initially positioned above susceptor 10 and workpiece 28 is then located in contact with protrusions 64 (the gridded surface) and rings 66. The contact of workpiece 28 and rings 66 of susceptor 10 limits backside deposition on the workpiece 28 and the contact between workpiece 28 and protrusions 64 limits lateral movement of the workpiece 28. Still further, the radially outward section 62 of susceptor 10 may be angled with respect to the radially inward section 60 to further limit backside deposition on the workpiece 28. Still further, the specific number of rings 66 may be at least five rings.

Figure 7:
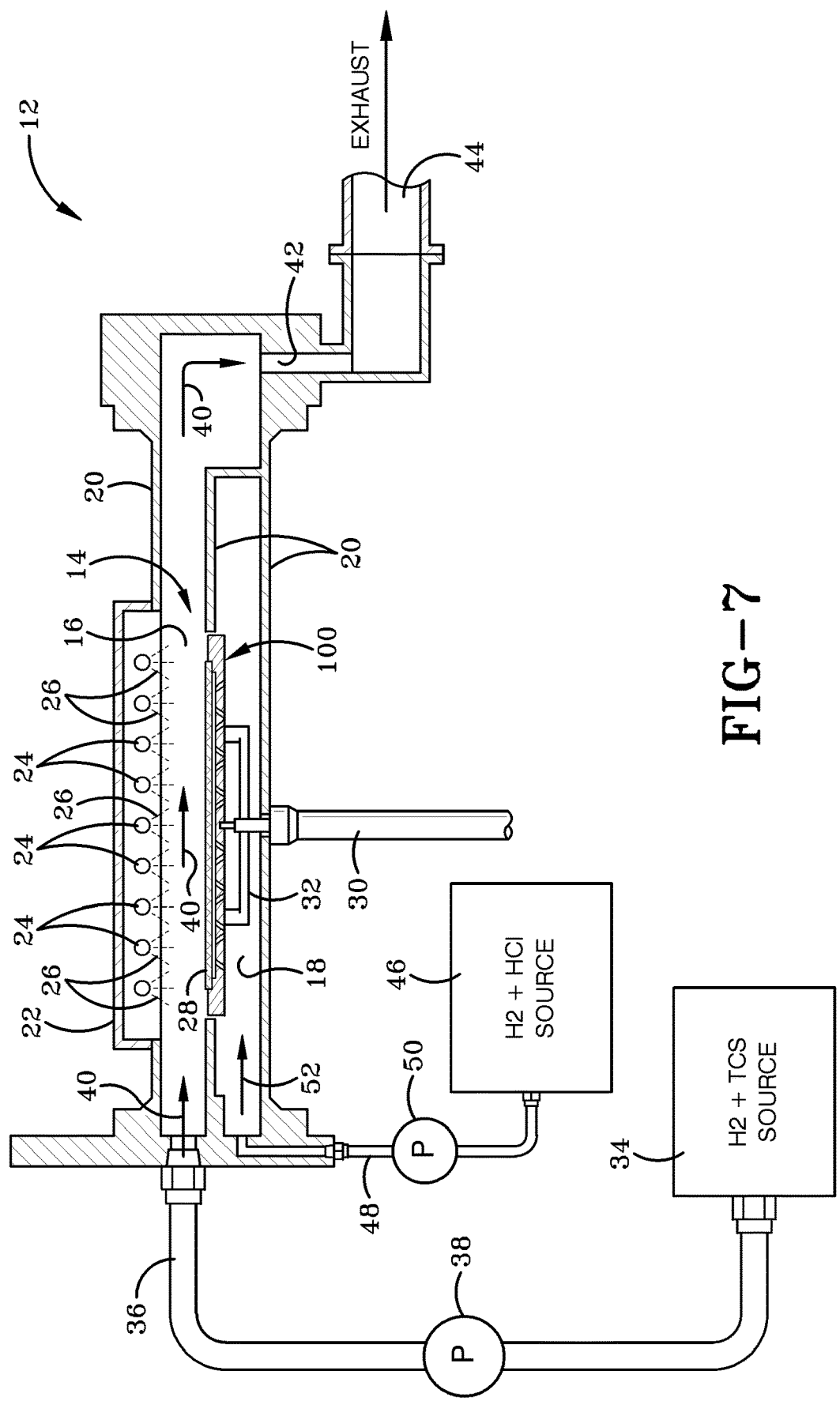
FIG. 7 schematically shows a cross-section of a semiconductor process module according to an embodiment of the present disclosure.
Figure 8:
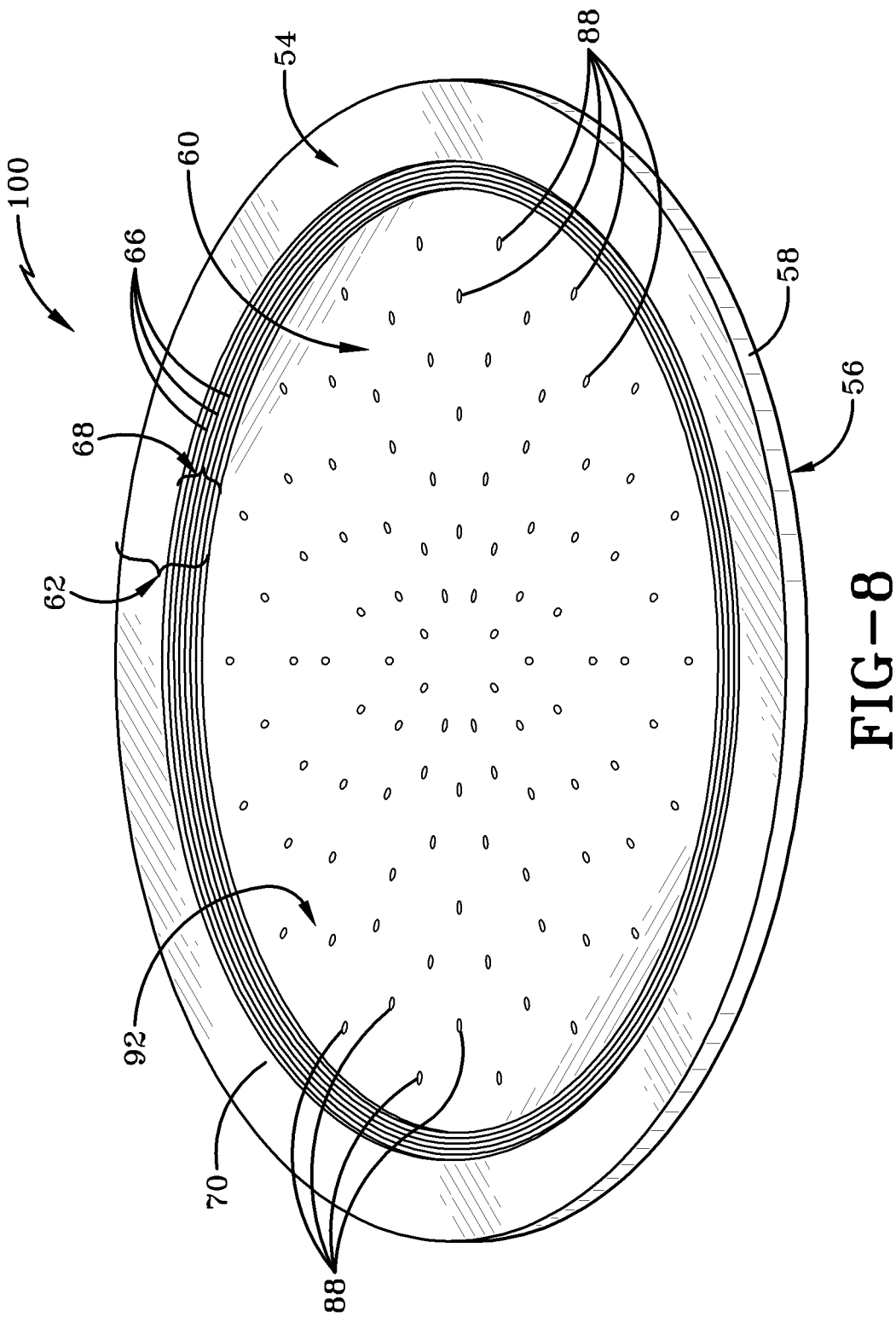
FIG. 8 is a perspective view of a susceptor top side according to an embodiment of the present disclosure.

Referring to FIGS. 7-9, susceptor 100 is shown with shoulder 70 adjacent rings 66 and a plurality of angled holes 88 extending through the radially inward section 60. Angled holes 88 extend from lower chamber 18 into backside processing area 92. During processing, a first process gas passes across wafer top surface 78 in the direction associated with arrows 90, while a second process gas passes through lower chamber 18 through angled holes 88 and into backside processing area 92 where the second process gas contacts a wafer bottom 76. This second process gas travels in the direction associated with arrows 94 and may leave the backside processing area 92 adjacent the susceptor 100 and wafer 28 or back through the lower chamber 18 as discussed above.

While the angled holes 88 are illustrated as angled, any suitable orientation may be utilized, including straight holes or any angle between. In one aspect, the lower chamber process gas may be hydrogen chloride (HCl) and is used to etch the bottom or backside 76 of wafer 28 to maintain a constant and consistent wafer backside. Further, maintaining a consistent wafer backside is important because it determines the overall thickness of the wafer and can create thickness irregularities. Thus, during a deposition step, HCl can be added to the lower chamber to reduce backside deposition, while between or after a deposition step, HCl can be used to etch the backside of any deposition thereon. While HCl has been highlighted as one potential etchant, any suitable etching chemistry may be utilized without departing from the spirit and scope of the disclosure.

These and other embodiments for methods and apparatus for a susceptor to reduce wafer sliding and backside deposition may incorporate concepts, embodiments, and configurations as described with respect to embodiments of apparatus for susceptors described above. The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

As used herein, the terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

What is claimed is:

1. A method of supporting a substrate comprising the steps of:

providing a susceptor in a reaction chamber, the susceptor comprising:
a generally circular body with a radially inward section having a face for receiving the substrate, the face having a gridded surface extending upward and a radially outward section having a plurality of rings extending upward,
wherein the radially inward section comprises a perimeter defined by an angled sidewall concentric with a most inward of the plurality of rings, wherein the angled sidewall comprises a plurality of holes extending through the body and wherein the angled sidewall comprises a plurality of inwardly protruding elongated protrusions;
positioning the substrate above the susceptor;
locating the substrate in contact with the face;
limiting a backside deposition with the contact between the plurality of rings and the substrate; and,
limiting lateral movement of the substrate to less than 2 mm with the contact between the gridded surface and the substrate.

2. The method of claim 1, wherein the radially outward section is angled with respect to the radially inward section.

3. The method of claim 2, wherein the angle is approximately three degrees.

4. The method of claim 1, wherein the plurality of rings includes at least five rings.

5. The method of claim 1, wherein limiting the backside deposition comprises controlling a flow of gas between the substrate and the susceptor.

6. The method of claim 1, wherein the gridded surface is at least partially concave in shape.

7. The method of claim 1, wherein the gridded surface further comprises a plurality of protrusions spaced apart from one another.

8. The method of claim 7, wherein each of the plurality of protrusions further comprises angled outer walls.

9. The method of claim 1, wherein each of the plurality of rings has a constant radius.

10. A method of supporting a substrate comprising the steps of:
providing a susceptor in a reaction chamber, the susceptor comprising:
a generally circular body having a face with a radially inward section and a radially outward section proximate a circumference of the body, the radially outward section having a plurality of plateaus, wherein the plateaus define continuous rings as seen in a top down view,
wherein each continuous ring extends upward for contacting a bottom surface of a substrate, wherein each continuous ring comprises a continuous loop of solid material extending up uniformly to an associated height, wherein the associated height of each successive continuous ring is successively lower with decreasing distance to the radially inward section,
wherein the radially inward section comprises a perimeter defined by an angled sidewall concentric with a most inward of the continuous rings, wherein the angled sidewall comprises a plurality of holes extending through the body and wherein the angled sidewall comprises a plurality of inwardly protruding elongated protrusions, and
wherein, upon retention of the substrate on an associated one of the continuous rings, the associated one of the continuous rings contacts the bottom surface of the substrate to prevent gases from reaching the bottom surface;
positioning the substrate above the susceptor; and
locating the substrate in contact with the face of the generally circular body.

11. The method of claim 10, limiting a backside deposition with the contact between the associated one of the continuous rings and the substrate.

12. The method of claim 11, wherein limiting the backside deposition comprises controlling a flow of gas between the substrate and the susceptor.

13. The method of claim 10, wherein the radially outward section is angled with respect to the radially inward section.

14. The method of claim 13, wherein the angle is approximately three degrees.

15. The method of claim 10, wherein the radially inward section further comprises a gridded surface extending upward from the face.

16. The method of claim 15, further comprising limiting lateral movement of the substrate to less than 2 mm with the contact between the gridded surface and the substrate.

17. The method of claim 15, wherein the gridded surface is at least partially concave in shape.

18. The method of claim 15, wherein the gridded surface further comprises a plurality of protrusions spaced apart from one another.

19. The method of claim 18, wherein each of the plurality of protrusions further comprises angled outer walls.

20. The method of claim 10, wherein the continuous rings include least five rings.

* * * * *